United States Patent
Tanaka et al.

(10) Patent No.: US 6,234,107 B1
(45) Date of Patent: May 22, 2001

(54) AUXILIARY VACUUM CHAMBER AND VACUUM PROCESSING UNIT USING SAME

(75) Inventors: Keiichi Tanaka; Masaki Sohma, both of Nirasaki; Shinsuke Asao; Masahito Ozawa, both of Yamanashi-Ken, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/235,644

(22) Filed: Jan. 22, 1999

(30) Foreign Application Priority Data

Jan. 26, 1998 (JP) .................................................. 10-026316

(51) Int. Cl.$^7$ .................................................. C23C 16/00
(52) U.S. Cl. ...................... 118/723 R; 118/719; 118/728; 156/345
(58) Field of Search ................................... 118/719, 728, 118/729, 723 R, 723 E, 723 ER, 723 IR, 723 I, 723 AN, 723 MW, 723 MA, 723 ME, 723 MR; 156/345; 204/298.25, 298.35; 414/217

(56) References Cited

U.S. PATENT DOCUMENTS

| | | | |
|---|---|---|---|
| 5,372,648 | * | 12/1994 | Yamamoto et al. ............. 118/723 E |
| 5,855,681 | * | 1/1999 | Maydan et al. ....................... 118/719 |
| 5,855,726 | * | 1/1999 | Soraoka et al. ...................... 156/345 |
| 5,882,165 | * | 3/1999 | Maydan et al. ...................... 414/217 |
| 5,932,014 | * | 8/1999 | Hayashi et al. ...................... 118/719 |
| 6,007,675 | * | 12/1999 | Toshima ............................... 156/345 |

* cited by examiner

Primary Examiner—Gregory Mills
Assistant Examiner—Luz Alejandro
(74) Attorney, Agent, or Firm—Smith, Gambrell & Russell, LLP

(57) ABSTRACT

An auxiliary vacuum chamber 12 according to the invention comprises a container 30 having an opening 10, 14 for taking an object to be processed W into and out of the container. A holder 33a is movably placed in the container 30, which can hold the object W taken therein. The holder 33a can also form a hermetically closed space 32a with a portion of the container 30 when moved in the container 30. The container 30 is provided with supplying means 38a for supplying a gas from the outside of the container 30 into the hermetically closed space 32a. The container 30 is also provided with exhaust means 37 for exhausting the gas from the hermetically closed space 32a to the outside of the container 30. According to the invention, the auxiliary vacuum chamber 12 need not have gate-valves for being opened and shut to the other chambers 4 and 16.

12 Claims, 6 Drawing Sheets

US 6,234,107 B1

AUXILIARY VACUUM CHAMBER AND VACUUM PROCESSING UNIT USING SAME

FIELD OF THE INVENTION

This invention relates to an auxiliary vacuum chamber used as a buffer or a load-lock chamber, and a vacuum processing unit which uses an auxiliary vacuum chamber, for metal film forming or etching.

BACKGROUND OF THE INVENTION

During the manufacture of semiconductor devices, various processes are conducted in a vacuum, such as etching, film forming, ashing process or sputtering. Separate vacuum processing units are used for these processes.

One type of conventional vacuum processing unit is the "cluster-tool" processing unit. It comprises a plural vacuum processing chamber, a conveying chamber connected to the plural vacuum processing chamber, an auxiliary vacuum chamber connected to the conveying chamber and having a load-lock mechanism, and a passing chamber connected to the auxiliary chamber. A conveying arm is typically provided in the conveying chamber for conveying substrates to be processed.

In the above vacuum processing unit, the conveying chamber and the plural vacuum chambers are maintained at a certain vacuum. Substrates such as wafers are passed from a transfer chamber to the conveying chamber through the auxiliary vacuum chamber. They are then conveyed by the conveying arm into their designated vacuum processing chambers where they undergo various processes. After being processed, they are conveyed back into the auxiliary vacuum chamber by the conveying arm and are passed back into the transfer chamber.

The auxiliary vacuum chamber is disposed between the transfer chamber which is kept at atmospheric pressure and the conveying chamber which is kept at a vacuum. The auxiliary vacuum chamber is maintained at a vacuum when semiconductor wafers are conveyed into and out of the conveying chamber, and is returned to atmospheric pressure when semiconductor wafers are conveyed into and out of the transfer chamber.

The auxiliary vacuum chamber has means for heating or cooling semiconductor wafers in preparation for the succeeding processing step. In addition, the auxiliary vacuum chamber may conduct degassing on the semiconductor wafers by means of heating.

The above auxiliary vacuum chamber has gates between the auxiliary vacuum chamber and other chambers to enable repeating the switching between atmospheric pressure and a vacuum. This makes costs high. In addition, repeated switching between the atmospheric pressure and the vacuum takes much time as gas has to be supplied into/removed from the entire auxiliary vacuum chamber. This prevents improvement of the throughput for all of the processes.

There have been proposals for making the interior of the whole auxiliary vacuum chamber in a vacuum to avoid the necessity to switch between atmospheric pressure and a vacuum. However, such a unit would also need a hermetically closed space for heating or cooling semiconductor wafers, and so would need gates between the auxiliary vacuum chamber and the other chambers.

SUMMARY OF THE INVENTION

Therefore, the object of this invention is to provide an auxiliary vacuum chamber having less gates or a vacuum processing unit which uses such an auxiliary vacuum chamber.

Another object of this invention is to provide an auxiliary vacuum chamber where switching between atmospheric pressure and a vacuum takes less time or a vacuum processing unit which uses such an auxiliary vacuum chamber.

To achieve the above objects, this invention is characterized by a feature in that an auxiliary vacuum chamber comprises: a container having an opening through which an object to be processed is taken into and out of the container, a holder movably placed in the container, which can hold the object taken therein through the opening and which can form a hermetically closed space with a portion of the container when moved in the container, supplying means for supplying a gas from an outside of the container into the hermetically closed space, and exhaust means for exhausting a gas from the hermetically closed space to the outside of the container.

This invention is also characterized by another feature in that an auxiliary vacuum chamber comprises: a container having an opening for taking an object to be processed into and out of the chamber, a holder movably placed in the container, which can hold the object taken therein through the opening and which can form a hermetically closed space with a portion of the container when moved in the container, and heating means for heating the hermetically closed space.

According to these features, the auxiliary vacuum chamber need not have gate-valves for being opened and shut to the other chambers since the holder holding the object forms a hermetically closed space with a portion of the container when moved in the container, and gas is supplied in the space by the supplying means to cool the object or heating means heats the object in the space. In addition, switching between atmospheric pressure and a vacuum takes less time since the volume of the hermetically closed space is smaller than that of the entire auxiliary vacuum chamber.

A vacuum processing unit comprising; a vacuum processing chamber which can be kept in a vacuum for conducting a process on an object to be processed in the vacuum, an auxiliary vacuum chamber having a load-lock mechanism, a conveying chamber connected to the vacuum processing chamber and the auxiliary vacuum chamber in a manner to be kept in a vacuum for conveying the object, and a transfer chamber connected to the auxiliary vacuum chamber in a manner to be kept in an atmospheric pressure, wherein the auxiliary vacuum chamber comprises: a container having an opening for taking the object therethrough into and out of one of the conveying chamber and the transfer chamber, a holder movably placed in the container, for holding the object taken therein through the opening and for forming hermetically closed space with a portion of the container, a gate valve disposed in the portion of the container defining the hermetically closed space for communicating with and closing to the other of the conveying chamber and the transfer chamber, supplying means for supplying a gas from an outside of the container into the hermetically closed space, and exhaust means for exhausting a gas from the hermetically closed space to the outside of the container.

According to this feature, the load-lock mechanism having only one gate-valve is achieved, which is advantageous in costs.

BEST MODE FOR CARRYING OUT THE INVENTION

Embodiments of the invention will now be described in more detail with reference to the drawings.

Figure 1:
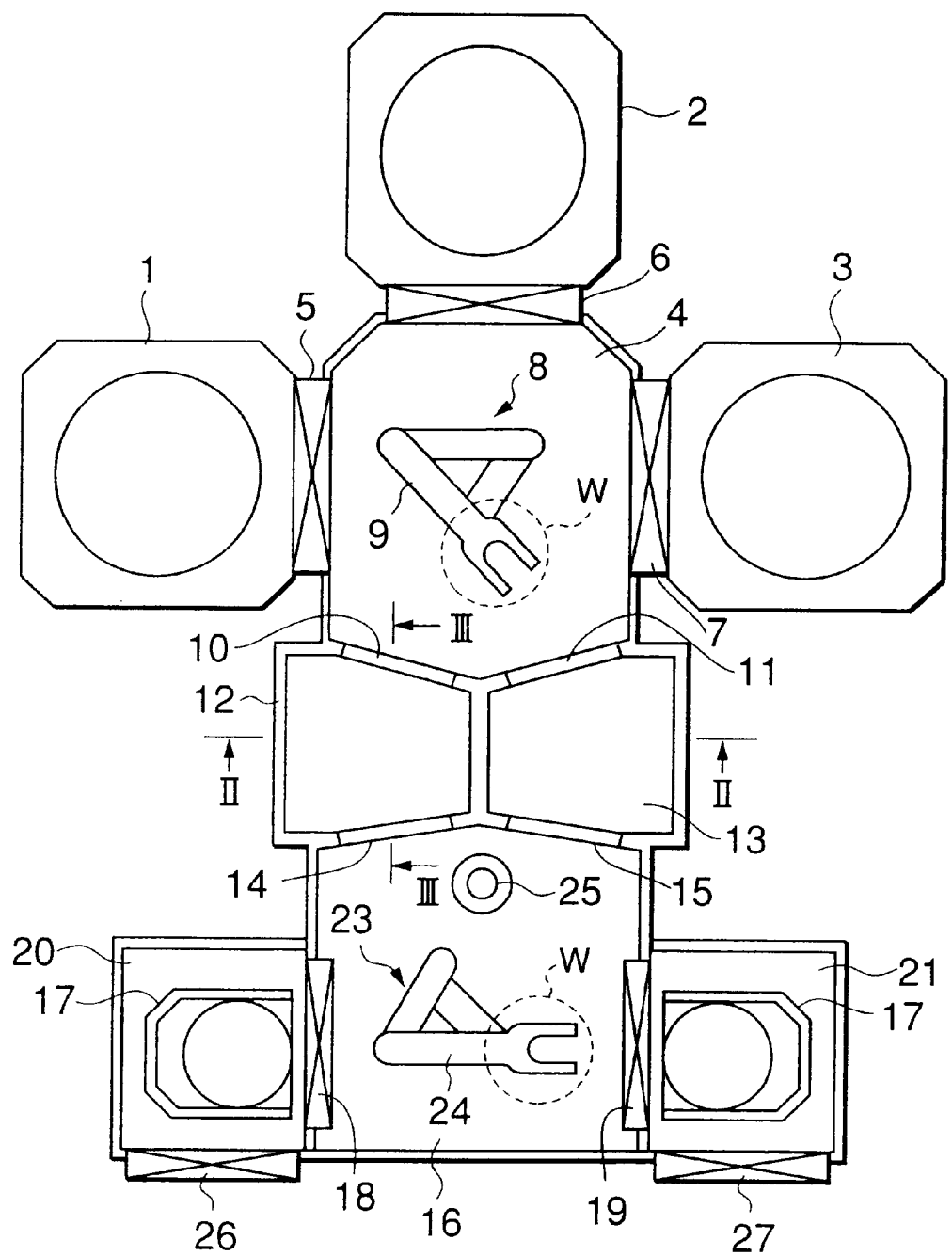
FIG. 1 is a plan view of an embodiment of a "cluster-tool" type of vacuum processing unit according to the invention.

FIG. 1 shows in plan view a vacuum processing unit according to an embodiment of the invention. The vacuum processing unit is of a "cluster-too" type.

The vacuum processing unit in FIG. 1 comprises three vacuum processing chambers 1, 2 and 3 where substrates to be processed such as semiconductor wafers undergo forming of a film of a metal such as titanium or tungsten in a predetermined vacuum. These vacuum processing chambers 1, 2 and 3 are connected to exhaust units respectively so that the chambers can be maintained at a certain vacuum by the exhaust units. These vacuum processing units 1, 2 and 3 are also connected to three sides of a conveying chamber 4 having a rectangular shape in plan via gate-valves 5, 6 and 7, respectively. The vacuum processing chamber 1, 2, and 3 can be openly communicated to the conveying chamber 4 by opening the gate-valves 5, 6 and 7 and can be closed to the conveying chamber 4 by shutting the gate-valves 5, 6 and 7. The conveying chamber 4 is also connected to an exhaust unit so that the chamber 4 can be maintained at substantially the same vacuum as in the vacuum processing units 1, 2 and 3 by the exhaust unit.

Two auxiliary vacuum chambers 12 and 13 are arranged on the remaining side of the conveying chamber 4 side by side. Each auxiliary vacuum chamber 12 or 13 has an opening 10 or 11 on the side of the conveying chamber 4. Each auxiliary vacuum chamber 12 or 13 may have at least one of cooling means for cooling semiconductor wafers W and heating means for heating the semiconductor wafers W, as described hereinafter.

The conveying chamber 4 has a wafer conveying unit 8 therein, which conveys semiconductor wafers W as substrates to be processed between each processing chambers 1, 2 or 3 or each auxiliary vacuum chamber 12 or 13 and the conveying chamber 4. The wafer conveying unit 8 consists of an arm mechanism disposed in substantially the center of the conveying chamber 4, having multiple joints, and a hand 9 mounted at the tip of the arm mechanism. The hand 9 is able to hold semiconductor wafers W therein.

Each auxiliary vacuum chamber 12 or 13 has also an opening 14 or 15 on the side opposite to the opening 10 or 11. Each auxiliary vacuum chamber 12 or 13 is connected to a wafer transfer chamber 16 via the opening 14 or 15. That is, the conveying chamber 4 and the wafer transfer chamber 16 are communicated via neutral portions 40 (see FIG. 2) of the auxiliary vacuum chambers 12 and 13. The wafer transfer chamber 16 is also connected to an exhaust unit (not shown) in order to be maintained at a vacuum.

The wafer transfer chamber 16 is connected to cassette chambers 20 and 21 on its left and right sides via gate-valves 18 and 19, respectively. Each cassette chamber 20 or 21 can accommodate a cassette 17 for loading or unloading the semiconductor wafers W. Each cassette chamber 20 or 21 can be openly communicated to the wafer transfer chamber 16 by opening the gate-valve 18 or 19 and can be closed to the wafer transfer chamber 16 by shutting the gate-valve 18 or 19. Each cassette chamber 20 or 21 has also a gate-valve 26 or 27 for taking the cassette 17 into and out of the chamber. Each cassette chamber 20 or 21 serves as a load-lock chamber, that is, the cassette chamber 20 or 21 is maintained at the atmospheric pressure when the cassette 17 is conveyed via the gate-valve 26 or 27, and is maintained at a vacuum when the cassette 17 is conveyed via the gate-valve 18 or 19.

The wafer transfer chamber 16 is provided with a second conveying unit 23 between the cassette chambers 20 and 21. The second conveying unit 23 consists of an arm mechanism having multiple joints, and a hand 24 mounted at the tip of the arm mechanism. The hand 24 is able to hold the semiconductor wafers W therein.

An alignment mechanism 25 is provided between the second conveying unit 23 and auxiliary vacuum chambers 12 and 13, for optically aligning the semiconductor wafers W, making use of the "orientation flat" of the semiconductor wafers. The semiconductor wafers W are conveyed into the auxiliary vacuum chamber 12 or 13 by the second conveying unit 23 after the semiconductor wafers W are once aligned by the alignment mechanism 25.

Figure 2:
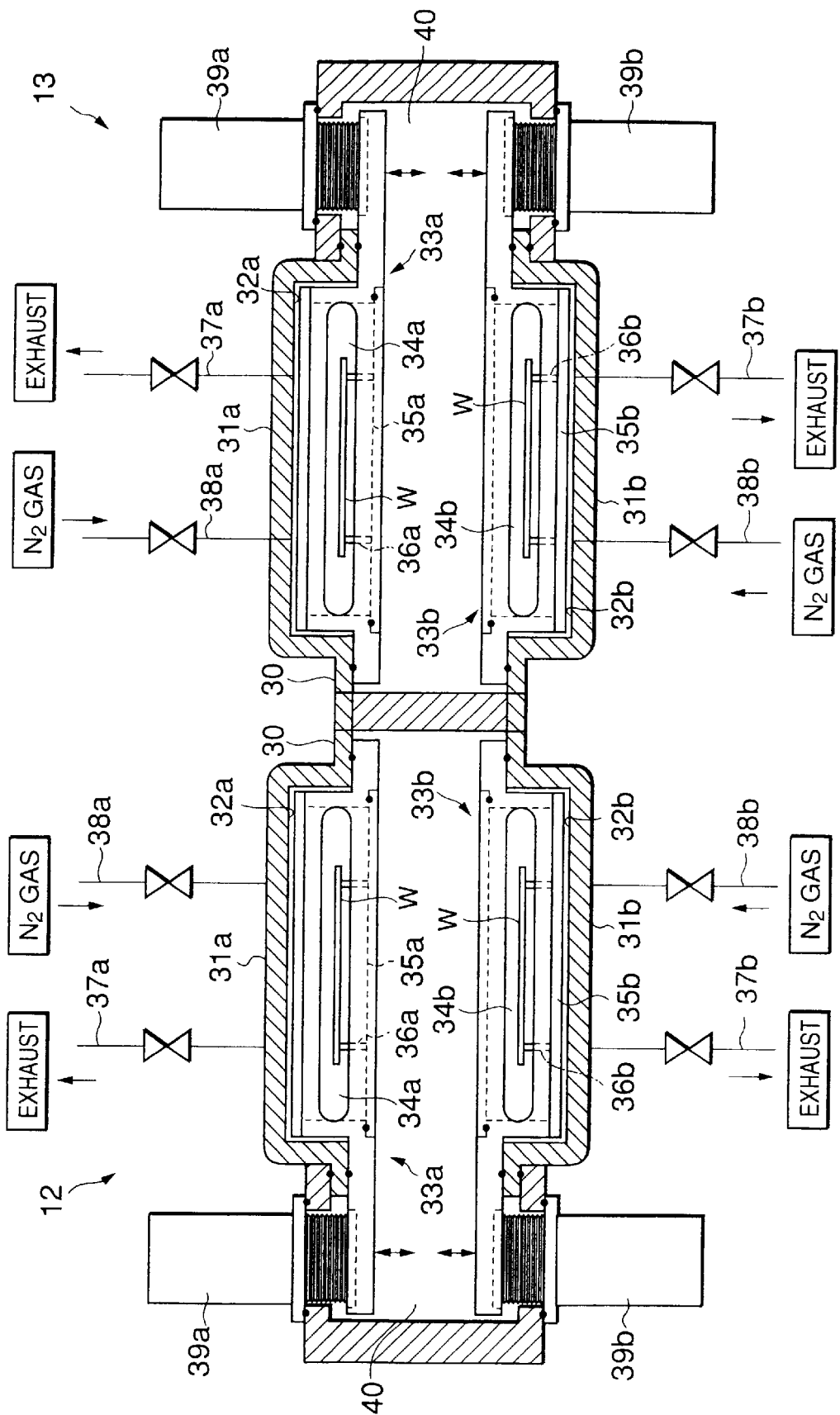
FIG. 2 is a sectional view of a vacuum processing unit in FIG. 1 taken along II—II.
Figure 3:
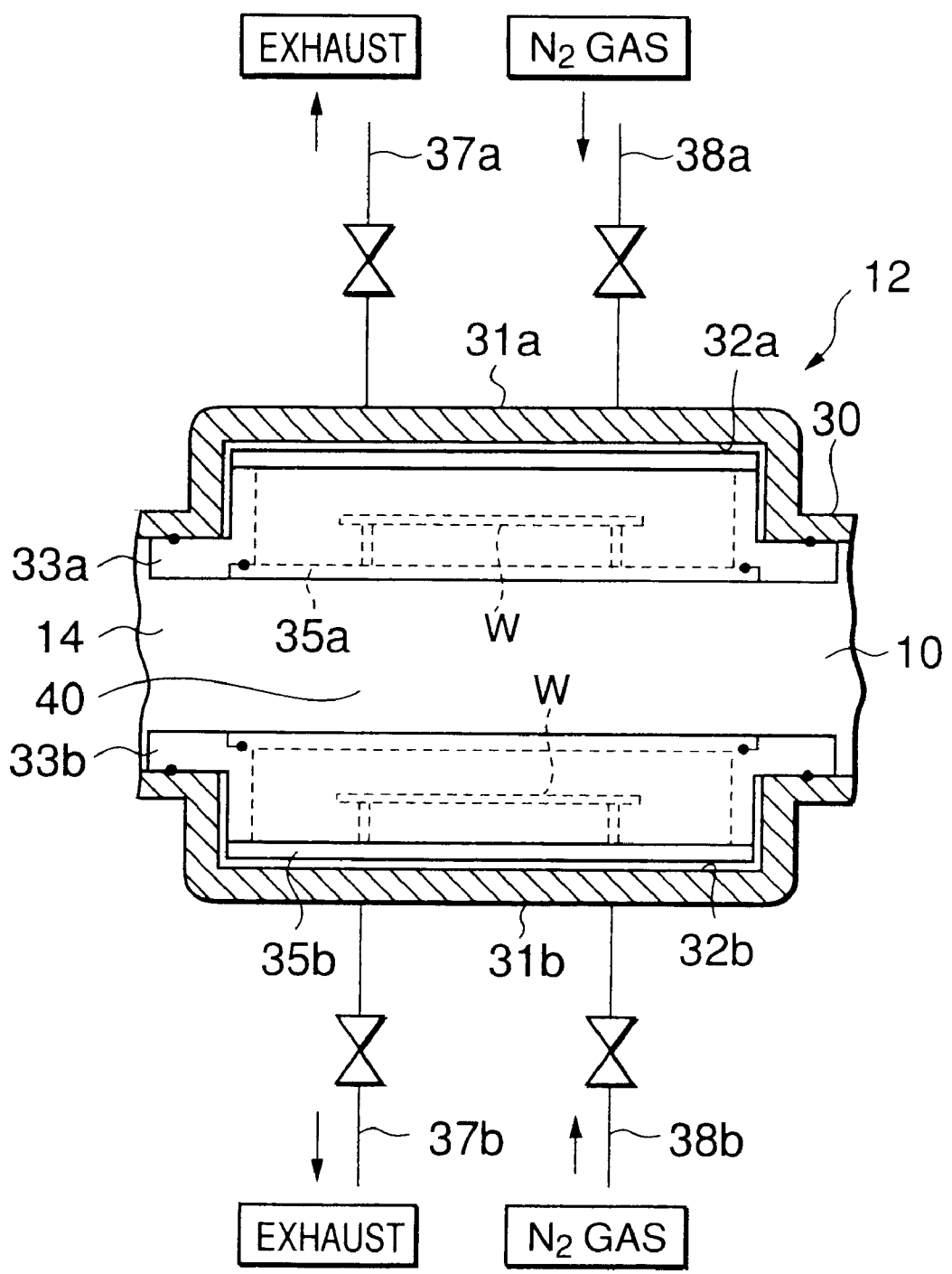
FIG. 3 is a sectional view of a vacuum processing unit in FIG. 1 taken along III—III.
Figure 4:
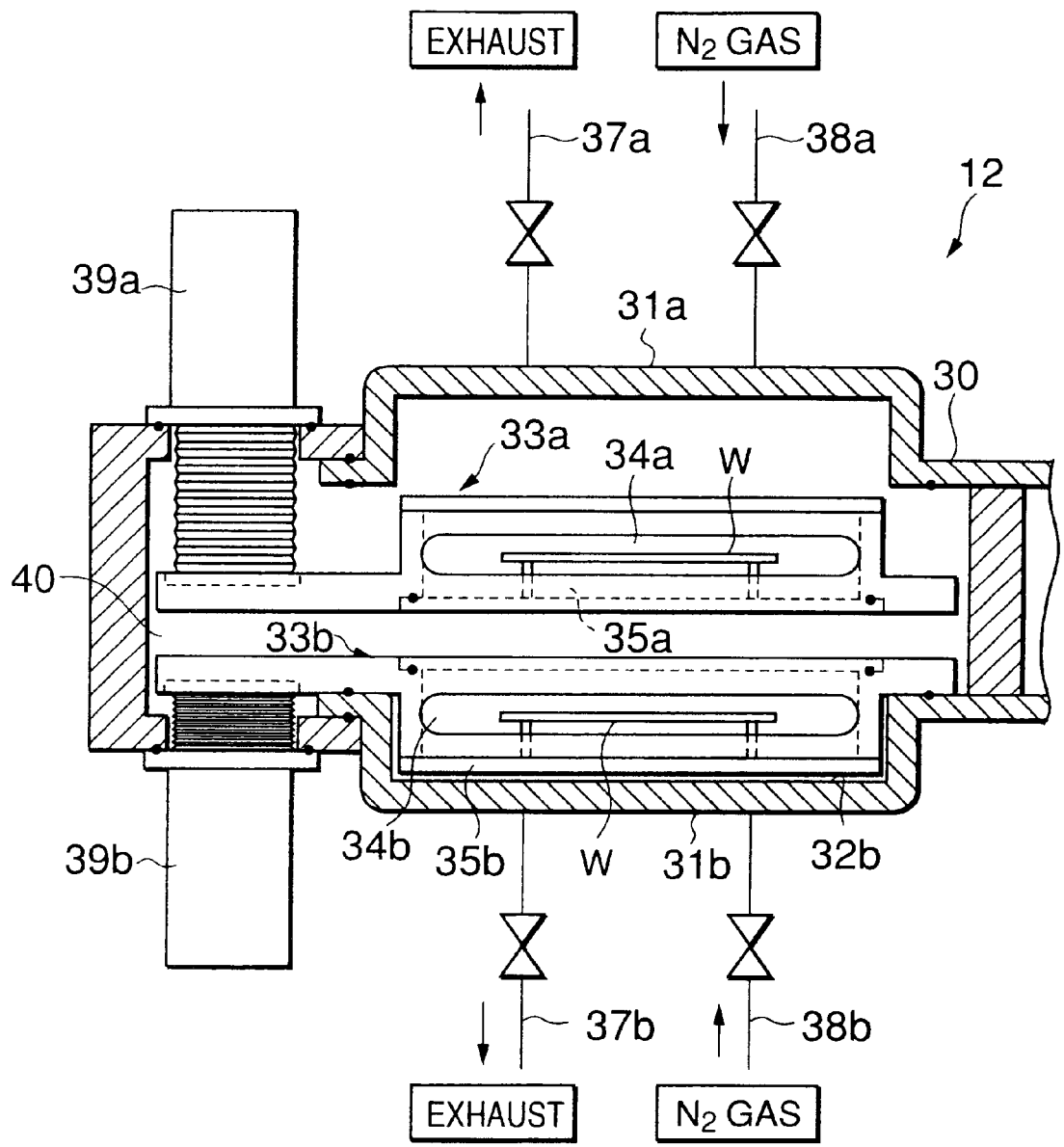
FIG. 4 is a sectional view of an auxiliary vacuum chamber in the vacuum processing unit of FIG. 1, showing the operation of the auxiliary vacuum chamber.

With reference to the FIGS. 2 to 4, the auxiliary vacuum chambers 12 and 13 will be described in more detail. FIG. 2 is a sectional view of a vacuum processing unit in FIG. 1 taken along II—II, and FIG. 3 is a sectional view of a vacuum processing unit in FIG. 1 taken along III—III. As shown in FIG. 2, the auxiliary vacuum chamber 13 is substantially the same as the auxiliary vacuum chamber 12 in the structure. Therefore only the auxiliary vacuum chamber 12 will be described below.

The auxiliary vacuum chamber 12 comprises a container 30 having protruding wall parts 31a and 31b in the upper and lower portions thereof and having a neutral portion 40 between the protruding wall parts 31a and 31b. Protruding wall parts refer to upper and bottom walls of the container which are depressed outwardly to form recess portion at the inner side. The recess portion receives a part of the wafer holder with a spatial margin. The auxiliary vacuum chamber 12 is provided with two wafer holders 33a and 33b therein, which can be moved vertically by drive mechanisms 39a and 39b, respectively. When the wafer holder 33a is raised, the wafer holder 33a is brought into tight contact with the inside wall of the container 30 via a sealing ring (not shown) so that the protruding wall part 31a and the wafer holder 33a form a hermetically closed space 32a. When the wafer holder 33b is moved downward, the wafer holder 33b is brought into tight contact with the inside wall of the container 30 via a sealing ring (not shown) so that the protruding wall part 31b and the wafer holder 33b form a hermetically closed space 32b. The airtight contact via the seal ring is typically made surrounding the recess portion of the container formed by the protruding wall part.

The wafer holder 33a has a wafer space for containing wafers. The wafer space is provided with windows 34a for taking the semiconductor wafers W into and out of the wafer space on both of the sides of the openings 10 and 14, respectively. A wafer support plate 35a having a plural wafer support pins 36a is mounted on a bottom portion of the wafer space. The wafer holder 33b has also a wafer space for containing wafers. The wafer space is also provided with windows 34b for taking the semiconductor wafers W into and out of the wafer space on both of the sides of the openings 10 and 14, respectively. A wafer support plate 35b having a plural wafer support pins 36b is mounted on a bottom portion of the wafer space.

The hermetically closed space 32a is communicated with an exhaust line 37a and a nitrogen ($N_2$) gas supplying line 38a. The hermetically closed space 32b is also communicated with an exhaust line 37b and a nitrogen gas supplying line 38b. When the wafer holder 33a or 33b holds semiconductor wafer W therein and the hermetically closed space 32a or 32b is formed, the semiconductor wafer W in the wafer holder 33a or 33b can be cooled by supplying the nitrogen gas into the space 32a or 32b through the gas supplying line 38a or 38b. As shown in FIG. 4, after the wafer W is cooled, the wafer holder 33a or 33b is moved in the neutral portion 40 by the drive mechanism 39a or 39b. The semiconductor wafer W in the wafer holder 33a or 33b is conveyed into the conveying chamber 4 or the wafer transfer chamber 16 via the opening 10 or 14. Then the wafer holder 33a or 33b waits for the next semiconductor wafer W to receive therein. FIG. 4 shows a state where the wafer holder 33a is moved in the neutral portion 40.

The waiting position of the wafer holder 33a or 33b for conveying (receiving or releasing) the semiconductor wafer W is preferably substantially the centre of the interior space of the container 30 and substantially the middle between the upper and lower protruding wall parts 31a and 31b. The wafer is held at substantially the same position by either one of the holders when the holder is at the waiting position. The driving means 39a and 39b are arranged to move the wafer holders 33a and 33b respectively at least between the above-mentioned waiting position and another position for forming the hermetically closed space with the portion of the container 30.

Figure 5:
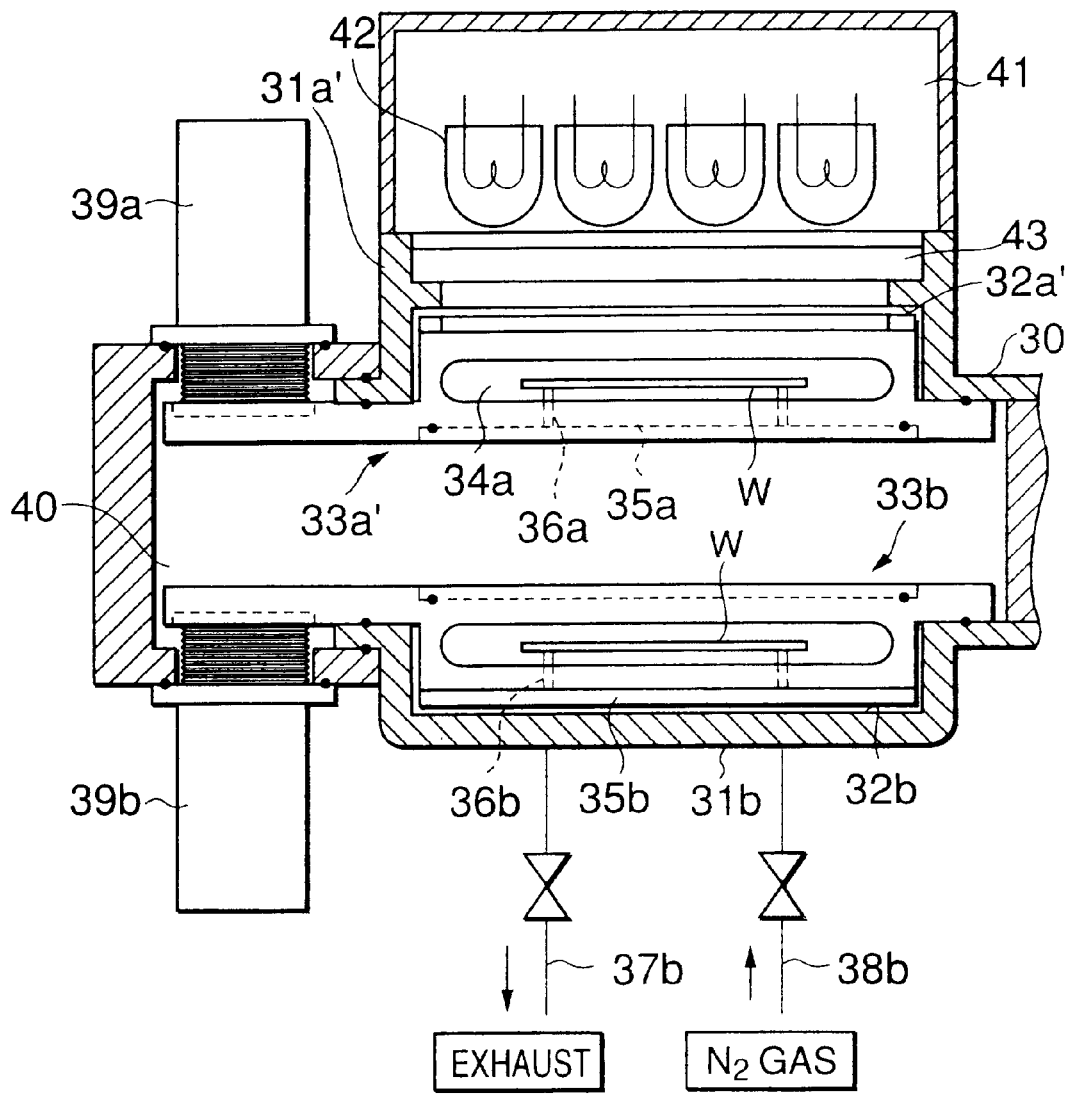
FIG. 5 is a sectional view of an auxiliary vacuum chamber having heating means and cooling means.

FIG. 5 shows an auxiliary vacuum chamber 12 having heating means. In the auxiliary vacuum chamber 12, a protruding part 31a' fitted with a transparent quartz plate 43 in the upper portion thereof is provided on the upper side of the container 30. A heating unit 41 having a plural heating lumps 42 is provided above the protruding part 31a'. The upper wafer holder 33a' has an opening in the upper side thereof in order to have semiconductor wafers W therein receive heat from the lumps 42. The other structure is the same as the above-mentioned wafer holder 33a. The lower portion of the auxiliary vacuum chamber 12 is the same as in FIGS. 2 and 3, but could have a heating unit in the same way as described above.

When the wafer holder 33a' is raised, the protruding part 31a' and the wafer holder 33a' form a hermetically closed space 32a'. When the heating lumps 42 are operated in that situation, the semiconductor wafer W held in the wafer holder 33a' can be preliminarily heated or can undergo degassing. The semiconductor wafer W can be cooled in the lower space 32b.

In the "cluster-tool" type vacuum processing unit of this embodiment, the cassettes 17 are conveyed into the cassette chambers 20 and 21, then both the gate-valves 26 and 27 are closed and the cassette chambers 20 and 21 are brought into a vacuum. Then the gate-valves 18 and 19 are opened to start processing. At this time, the vacuum processing chamber 1, 2 and 3, the conveying chamber 4, auxiliary vacuum chambers 12 and 13 and the wafer transfer chamber 16 are maintained at a vacuum in advance. The gate-valves 18 and 19 are kept open until the batch processing of a batch of wafers W has completed.

For the processing, a semiconductor wafer W is conveyed from the cassette 17 in the cassette chamber 20 or 21 into the wafer transfer chamber 16 by the second conveying unit 23. The semiconductor wafer W is aligned by the alignment mechanism 25 and is conveyed into the auxiliary vacuum chamber 12 or 13 through the opening 14 or 15, respectively. In the auxiliary vacuum chamber 12 or 13, as described above, the hermetically closed space is formed and the semiconductor wafer W is preliminarily cooled, is preliminarily heated or undergoes degassing. After such an auxiliary processing, the semiconductor wafer W is conveyed into the conveying chamber 4 through the opening 10 or 11 by the conveying unit 8. Then the wafer W is conveyed into the vacuum processing chamber 1, 2 or 3 by the conveying unit 8 in order to undergo a prescribed process, for example, forming of a film of a metal such as titanium, aluminum or tungsten. After one processing, the wafer can be conveyed into another processing chamber in order to undergo another prescribed process, if necessary.

After the semiconductor wafer W undergoes all of the processes, the wafer W is conveyed into the auxiliary vacuum chamber 12 or 13 through the opening 10 or 11, respectively, by the conveying unit 8. In the auxiliary vacuum chamber 12 or 13, the hermetically closed space is formed and the semiconductor wafer W undergoes cooling or heating. Thereafter, the semiconductor wafer W is conveyed into the transfer chamber 16 through the opening 14 or 15 by the second conveying unit 23. Then, the wafer W is conveyed into and received in a wafer cassette 17 in the cassette chamber 20 or 21.

As described above, in the auxiliary vacuum chamber 12 or 13, the moving wafer holder 33a, 33b or 33a' and the protruding parts 31a, 31b or 31a' of the container 30 form the hermetically closed space where the semiconductor wafer W can be cooled or heated. Thus, the auxiliary vacuum chamber 12 or 13 need not have gate-valves for being opened and shut to the conveying chamber 4 and the wafer transfer chamber 16. This can reduce the costs of the unit. Furthermore, while supply and exhaust of the gas are necessary to cool the semiconductor wafer W, supply and exhaust of the gas take much less time in this embodiment since the gas is supplied into and exhausted from the hermetically closed space whose volume is smaller than that of the entire auxiliary vacuum chamber.

Figure 6:
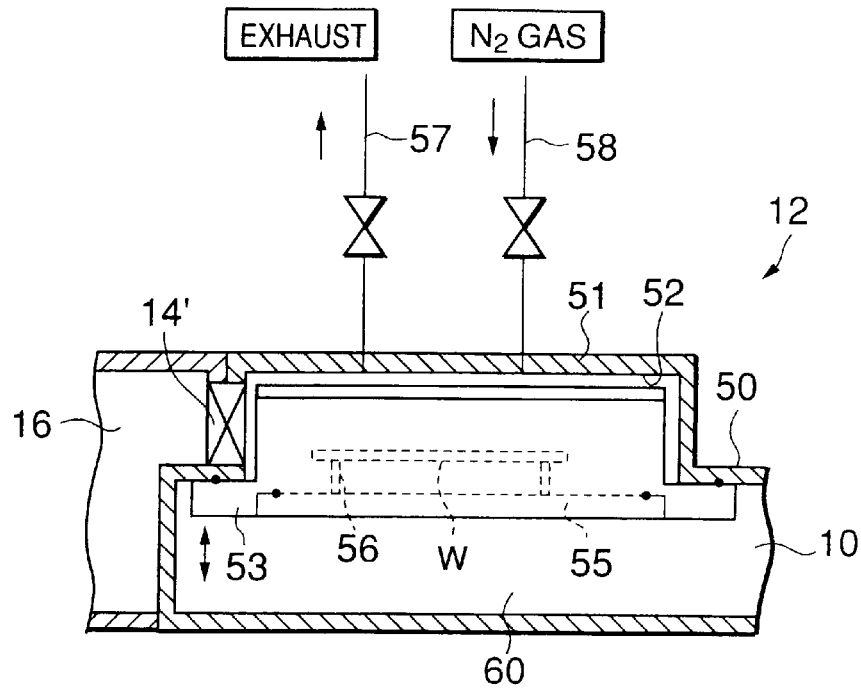
FIG. 6 is a sectional view of an auxiliary vacuum chamber having a load-lock mechanism.
Figure 7:
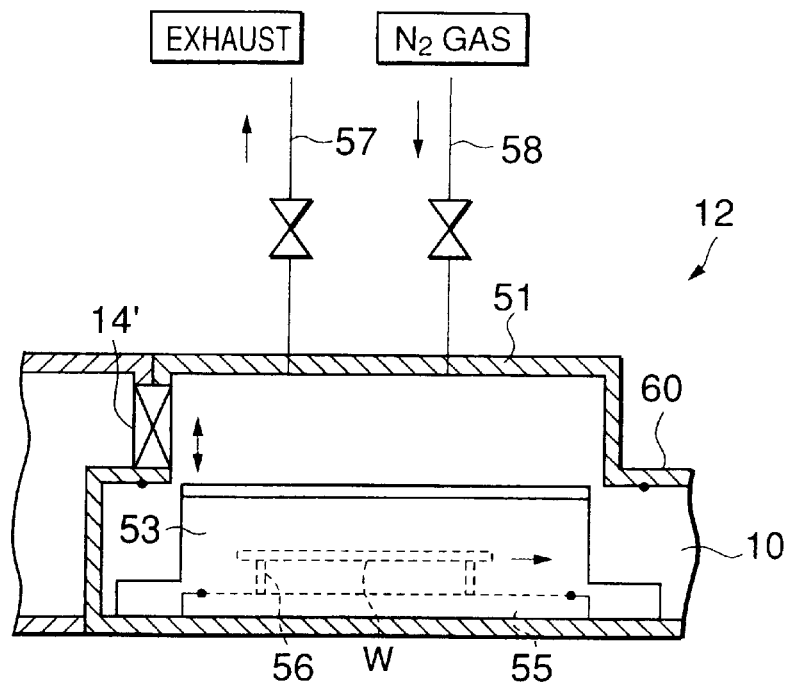
FIG. 7 is a sectional view of an auxiliary vacuum chamber of FIG. 6, showing the operation of the auxiliary vacuum chamber.

FIGS. 6 and 7 show in sectional view another embodiment of the auxiliary vacuum chamber according to the invention. While the processing unit of the embodiment described above is maintained at a vacuum throughout the entire processing unit, the processing unit of this embodiment maintains a wafer transfer chamber 16 at the atmospheric pressure and uses auxiliary vacuum chambers 12 and 13 as load-lock chambers. The auxiliary vacuum chamber 13 is also substantially the same as the auxiliary vacuum chamber 12 in the embodiment. Therefore only the auxiliary vacuum chamber 12 will be described below.

As shown in FIG. 6, the auxiliary vacuum chamber 12 comprises a container 50 having a protruding part 51 in the upper portion thereof and having a base part 60 in the lower portion thereof. The auxiliary vacuum chamber 12 is provided with a wafer holder 53 therein, which can be moved vertically by drive mechanism (not shown). When the wafer holder 53 is raised, the wafer holder 53 is brought into tight contact with the inside wall portion of the container 50 via a sealing ring (not shown) so that the protruding part 51 and the wafer holder 53 form a hermetically closed space 52. An opening and a gate-valve 14' are provided between the protrusion 51 and the wafer transfer chamber 16. The auxiliary vacuum chamber 12 has also an opening 10 on the side of the conveying chamber 4 similarly to the embodiment described before.

The wafer holder 53 has a wafer space for containing the wafer. The wafer space is provided with windows for taking the semiconductor wafers W into and out of the wafer space on both of the sides of the openings 10 and 14', respectively. A wafer support plate 55 having a plural wafer support pins 56 is mounted on the bottom portion of the wafer space.

The hermetically closed space 52 is communicated with an exhaust line 57 and a nitrogen ($N_2$) gas supplying line 58. When the wafer holder 53 holds semiconductor wafers W therein and the hermetically closed space 52 is formed, the space 52 can be brought into a vacuum by exhausting the gas in the space 52 through the exhaust line 57 and can be reverted to the atmospheric pressure by supplying nitrogen gas into the space 52 through the nitrogen gas supplying line 58.

In the auxiliary vacuum chamber 12 of this embodiment, as shown in FIG. 6, when the hermetically closed space 52 is formed, the space 52 can be brought into the atmospheric pressure by supplying nitrogen gas thereinto. Then the gate-valve 14' is opened and a semiconductor wafer W is conveyed from the wafer transfer chamber 16 in the atmospheric pressure into the hermetically closed space 52. Then the gate-valve 14' is closed and the hermetically closed space 52 is brought into a vacuum by exhausting the gas in the space 52 through the exhaust line 57. As shown in FIG. 7, the wafer holder 53 is moved toward the base portion 60 by the drive mechanism. The semiconductor wafer W held in the wafer holder 53 is conveyed into the conveying chamber 4 through the opening 10.

The auxiliary vacuum chamber in the embodiment serves as a load-lock chamber using only one gate-valve. That is, the auxiliary vacuum chamber achieves the reduction of the number of the gate-valves used therein which is two or more in conventional load-lock chambers. In addition, the switching between the atmospheric pressure and the vacuum takes less time as the gas is supplied into and removed from the hermetically closed space whose volume is smaller than that of the entire auxiliary vacuum chamber. This improves the throughput for all of the processes.

The gate-valve is provided on the side of the chamber in the atmospheric pressure in the embodiment, but may be provided on the side of the chamber in a vacuum. In the latter case, after the hermetically closed space 52 is brought into a vacuum, the gate-valve is opened and the wafer W in the space 52 is conveyed into and out of the chamber in a vacuum. The wafer W in the space 52 is conveyed into and out of the chamber in the atmospheric pressure through the opening on the contrary.

This invention is not limited by the above embodiments and may be modified variously within the scope of claim. For example, the auxiliary vacuum chambers in the above embodiments have openings on both sides thereof, but another auxiliary vacuum chamber having an opening could be connected to the conveying chamber in a side-by-side arrangement with the vacuum processing chambers. The vacuum processing chambers can conduct not only film forming but also etching and so on. The object to be processed can be not only a semiconductor wafer but also a LCD substrate and so on.

What is claimed is:

1. A vacuum chamber comprising;
   a container having at least two openings through which only an object to be processed is taken into and out of the container, said at least two openings being horizontally arranged;
   a holder movably placed in the container, for holding the one object taken therein through the opening and for forming a hermetically closed space with a portion of the container when moved in the container, said hermetically closed space having a volume that substantially corresponds to the one object held by the holder;
   supplying means for supplying a gas from an outside of the container into the hermetically closed space; and
   exhaust means for exhausting a gas from the hermetically closed space to the outside of the container.

2. A vacuum chamber according to claim 1, further comprising;
   heating means for heating the object held in the hermetically closed space.

3. A vacuum chamber according to claim 2, wherein:
   the vacuum chamber further comprises,
      a second holder movably placed in the container, for holding the object taken therein through an opening and for forming a second hermetically closed space with another portion of the container when moved in the container, said second hermetically closed space having a volume that substantially corresponds to the one object held by the second holder.

4. A vacuum chamber according to claim 3, wherein the first holder is movable between a first position where the object is received or released and a second position where the first hermetically closed space is formed, and the second holder is movable between a third position where the object is held at substantially the same position as in the first position of the first holder and the object is received or released and the fourth position where the second hermetically closed space is formed.

5. A vacuum chamber according to claim 1, wherein:
   the vacuum chamber further comprises,
      a second holder movably placed in the container, for holding the object taken therein through an opening and for forming a second hermetically closed space with another portion of the container when moved in the container said second hermetically closed space having a volume that substantially corresponds to the one object held by the second holder.

6. A vacuum chamber according to claim 5, wherein the first holder is movable between a first position where the object is received or released and a second position where the first hermetically closed space is formed, and the second holder is movable between a third position where the object is held at substantially the same position as in the first position of the first holder and the object is received or released and the forth position where the second hermetically closed space is formed.

7. A vacuum chamber according to claim 5, further comprising a means for heating the object held on one of the holders in one of the hermetically closed space.

8. A vacuum chamber according to claim 1, wherein:
   the holder is adapted to move between a first position in substantially a centre of an interior space of the container for receiving or releasing the object and a second position for forming the hermetically closed space with the portion of the container, by making an airtight contact.

9. A vacuum chamber according to claim 1, wherein the container has a wall depressed outwardly forming a recess portion at the inside thereof, and the hermetically closed space is formed to include the recess portion by an annular airtight contact surrounding the recess portion, the airtight contact being made between the holder and an inner wall of the container.

10. A vacuum processing unit comprising;
- a vacuum processing chamber which can be kept in a vacuum for conducting a process on an object to be processed in the vacuum;
- an auxiliary vacuum chamber;
- a conveying chamber connected to the vacuum processing chamber and the auxiliary vacuum chamber in a manner to be kept in a vacuum for conveying the object;
- a cassette chamber for loading or unloading the object; and
- a transfer chamber connected to the auxiliary vacuum chamber and the cassette chamber, the transfer chamber having a means for transferring the object between the cassette chamber and the auxiliary vacuum chamber;
- wherein the auxiliary vacuum chamber comprises:
  - a container having a first opening opened to the conveying chamber and a second opening opened to the transfer chamber, the first opening and the second opening being horizontally arranged;
  - a holder movably placed in the container, for holding the object and for forming a hermetically closed space by making an airtight contact with an inner wall of the container in a manner that the object is held in the hermetically closed space, said hermetically closed space having a volume that substantially corresponds to the one object held by the holder;
  - means for supplying a gas into the hermetically closed space; and
  - means for exhausting a gas from the hermetically closed space.

11. A vacuum processing unit according to claim 10, further comprising one or more vacuum processing chambers connected to the conveying chamber.

12. A vacuum chamber comprising:
- a container having an opening through which an object to be processed is taken into and out of the container;
- a holder movably placed in the container, for holding the object taken therein through the opening and for forming a hermetically closed space with a portion of the container when moved in the container;
- supplying means for supplying a gas from an outside of the container into the hermetically closed space; and
- exhaust means for exhausting a gas from the hermetically closed space to the outside of the container,
- wherein the container has a wall which is depressed outwardly to form a recess portion at the inside thereof, and the hermetically closed space is formed to include the recess portion by an annular airtight contact surrounding the recess portion, the airtight contact being made between the holder and an inner wall of the container.

* * * * *